(12) United States Patent
Drost et al.

(10) Patent No.: US 6,812,046 B2
(45) Date of Patent: Nov. 2, 2004

(54) METHOD AND APPARATUS FOR ELECTRONICALLY ALIGNING CAPACITIVELY COUPLED CHIP PADS

(75) Inventors: Robert J. Drost, Mountain View, CA (US); Ivan E. Sutherland, Santa Monica, CA (US); Gregory M. Papadopoulos, Los Altos Hills, CA (US)

(73) Assignee: Sun Microsystems Inc., Santa Clara, CA (US)

( * ) Notice: Subject to any disclaimer, the term of this patent is extended or adjusted under 35 U.S.C. 154(b) by 43 days.

(21) Appl. No.: 10/207,671

(22) Filed: Jul. 29, 2002

(65) Prior Publication Data

US 2004/0018654 A1 Jan. 29, 2004

(51) Int. Cl.[7] .............................................. H01L 21/66
(52) U.S. Cl. .............................. 438/14; 438/15; 438/16
(58) Field of Search .............................. 438/14, 15, 16

(56) References Cited

U.S. PATENT DOCUMENTS

| | | | | |
|---|---|---|---|---|
| 6,551,844 B1 | * | 4/2003 | Eldridge et al. | 438/14 |
| 6,566,149 B1 | * | 5/2003 | Kanamaru et al. | 438/14 |
| 6,597,191 B2 | * | 7/2003 | Oosawa et al. | 324/763 |
| 6,600,325 B2 | * | 7/2003 | Coates et al. | 324/519 |
| 6,621,294 B2 | * | 9/2003 | Hsu et al. | 326/37 |
| 6,630,685 B1 | * | 10/2003 | Lunde | 257/48 |
| 2002/0183003 A1 | | 12/2002 | Chang et al. | 455/41 |

FOREIGN PATENT DOCUMENTS

WO  WO01/28003 A1  4/2001  .......... H01L/31/00

OTHER PUBLICATIONS

Publication entitled: "Manufacturability of Capacitively Coupled Multichip Modules" by Thomas F. Knight, Jr., Ph D., and David B. Salzman, Ph D., 1994 IEEE, pp. 605 to 608.

* cited by examiner

*Primary Examiner*—John Niebling
*Assistant Examiner*—Olivia T. Luk
(74) *Attorney, Agent, or Firm*—Park, Vaughan & Fleming LLP

(57) ABSTRACT

One embodiment of the present invention provides a system that electronically aligns pads on different semiconductor chips to facilitate communication between the semiconductor chips through capacitive coupling. The system operates by measuring an alignment between a first chip and a second chip, wherein the first chip is situated face-to-face with the second chip so that transmitter pads on the first chip are capacitively coupled with receiver pads on the second chip. Next, the system uses the measured alignment to associate transmitter pads on the first chip with proximate receiver pads on the second chip. The system then selectively routes data signals to transmitter pads on the first chip so that the data signals are communicated through capacitive coupling to intended receiver pads in the second chip that are proximate to the transmitter pads.

25 Claims, 10 Drawing Sheets

VERTICAL MULTIPLEXER

| Vsel | OUT |
|---|---|
| UP | A |
| DOWN | B |

HORIZONTAL MULTIPLEXER

| Vinv | Hinv | Hsel | OUT |
|---|---|---|---|
| F | F | LEFT | C |
| F | T | LEFT | C |
| T | F | LEFT | C |
| T | T | LEFT | Gnd |
| F | F | RIGHT | D |
| F | T | RIGHT | D |
| T | F | RIGHT | D |
| T | T | RIGHT | Gnd |

METHOD AND APPARATUS FOR ELECTRONICALLY ALIGNING CAPACITIVELY COUPLED CHIP PADS

BACKGROUND

1. Field of the Invention

The present invention relates to the process of transferring data between integrated circuits. More specifically, the present invention relates to a method and an apparatus for aligning capacitive transmitter pads on a first chip with capacitive receiver pads on a second chip in a manner that can tolerate variations in alignment between the first chip and the second chip.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

However, it is not a simple matter to align the chips properly. One possible alignment technique is to mechanically align the chips during the assembly process and to then bond the chips together with an adhesive. Unfortunately, permanently bonding incompletely tested chips can give rise to the multi-chip-module (MCM) problem, in which a bad $5 chip can ruin a $1000 MCM. In order to allow chips to be replaced they cannot be firmly attached to each other.

What is needed is a method and an apparatus for aligning capacitive transmitter pads on a first chip with capacitive receiver pads on a second chip in a manner that can tolerate variations in alignment between the first chip and the second chip.

Note that the simplest method to tolerate misalignments is to make the transmitter pads and/or receiver pads larger, but this reduces the number of pads that can be integrated into a given semiconductor chip and thereby decreases inter-chip communication bandwidth.

SUMMARY

One embodiment of the present invention provides a system that electronically aligns pads on different semiconductor chips to facilitate communication between the semiconductor chips through capacitive coupling. The system operates by measuring an alignment between a first chip and a second chip, wherein the first chip is situated face-to-face with the second chip so that transmitter pads on the first chip are capacitively coupled with receiver pads on the second chip. Next, the system uses the measured alignment to associate transmitter pads on the first chip with proximate receiver pads on the second chip. The system then selectively routes data signals to transmitter pads on the first chip so that the data signals are communicated through capacitive coupling to intended receiver pads in the second chip that are proximate to the transmitter pads.

In a variation on this embodiment, there are a greater number of smaller transmitter pads than receiver pads so that multiple transmitter pads can drive a single receiver pad. In this variation, multiple transmitter pads under a single receiver pad are driven with the same signal.

In a variation on this embodiment, driving the multiple transmitter pads with the same signal additionally involves driving adjacent transmitter pads with an inverse signal to provide return current.

In a variation on this embodiment, the transmitter pads collectively cover more area than the receiver pads so that the receiver pads remain proximate to transmitter pads in spite of alignment variations between the first chip and the second chip.

In a variation on this embodiment, the transmitter pads are located in the highest metal layer of the first chip, and the receiver pads are located in the highest metal layer of the second chip.

In a variation on this embodiment, the transmitter pads are covered by an overglass layer on the first chip, and the receiver pads are covered by an overglass layer on the second chip.

In a variation on this embodiment, selectively routing the data signals to transmitter pads involves using a multiplexing array to selectively route the data signals.

In a variation on this embodiment, the alignment process takes place either periodically or continuously.

In a variation on this embodiment, the transmitter pads are arranged in a two-dimensional array on the first chip, and the receiver pads are arranged in a two-dimensional array on the second chip.

In a variation on this embodiment, the receiver pads and transmitter pads are square.

In a variation on this embodiment, the receiver pads and the transmitter pads are not square.

Note that the above-described techniques relax the need for precise mechanical alignment and allows the two chips to move relative to each other during operation. As such, chips situated face-to-face do not require an adhesive bond. Hence, this technique facilitates easy removal and replacement of bad chips, thereby reducing the requirement for known good chips and improving overall assembly yield.

BRIEF DESCRIPTION OF THE FIGURES

FIG. 9 illustrates different transmitter array electrical assignments in accordance with an embodiment of the present invention.

FIG. 10 illustrates different electrical assignments for another transmitter array in accordance with an embodiment of the present invention.

FIG. 13 illustrates transmitter array electrical assignments for a three-by-three receiver array in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Aligned Receiver Pads Overlapping with Transmitter Pads

Figure 1:
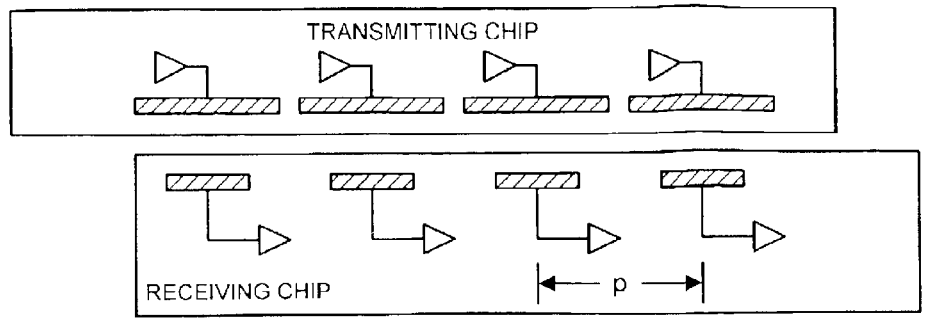
FIG. 1 illustrates transmitter pads aligned with receiver pads in accordance with an embodiment of the present invention.

FIG. 1 illustrates a cross-section of a transmitter and receiver pad configuration that includes aligned receiver pads overlapping with transmitter pads. In this example, there is one transmitter pad for each receiver pad.

Figure 2:
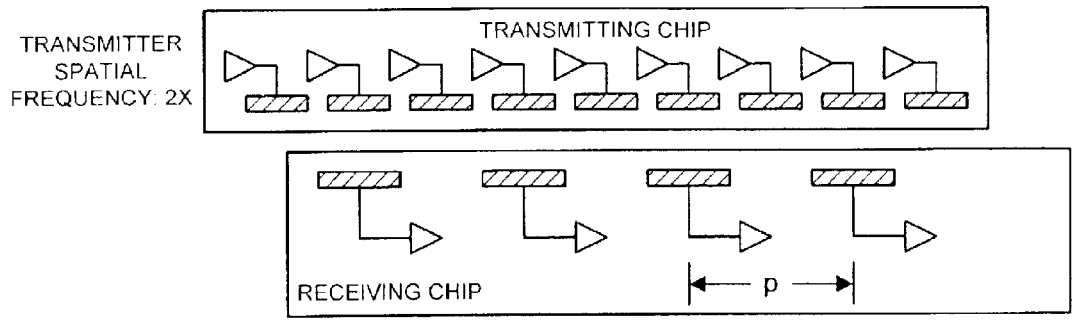
FIG. 2 illustrates several different spatial frequencies for transmitter pads in accordance with an embodiment of the present invention.
Figure 2:
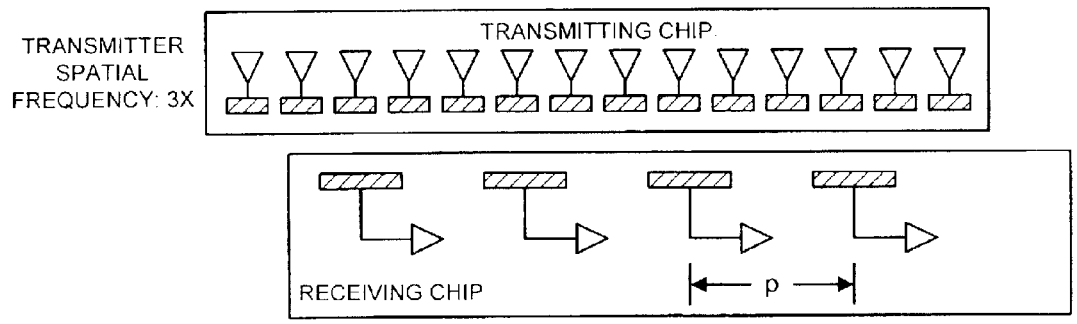
Figure 2:
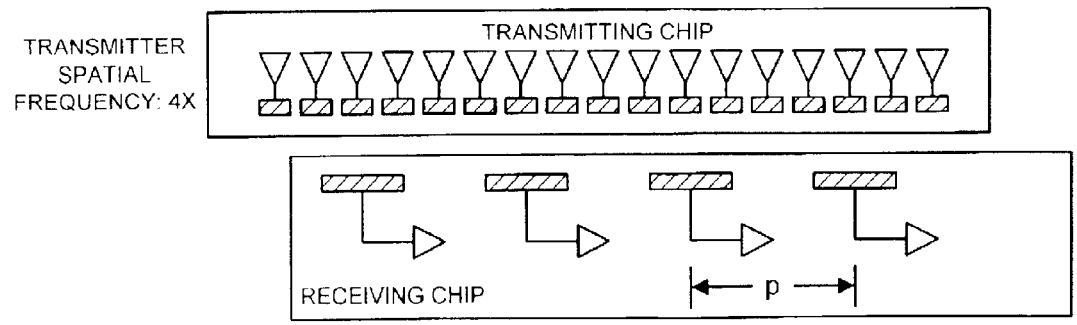

FIG. 2 illustrates additional configurations with increased transmitter spatial frequency in accordance with an embodiment of the present invention. These increased transmitter frequencies are accomplished by inserting additional smaller transmitter pads between each receiver pad. These additional transmitter pads can be enabled selectively to compensate for alignment variations between the transmitter chip and the receiver chip. Selecting among finer grain transmitter pads allows for greater misalignments than the fixed pads illustrated in FIG. 1. Moreover, use of higher spatial frequencies allows for the receiver pad area to be covered completely with the correct data and allows for some pads between receiver pads to be turned off or to transmit inverse signals to provide return currents.

Figure 3:
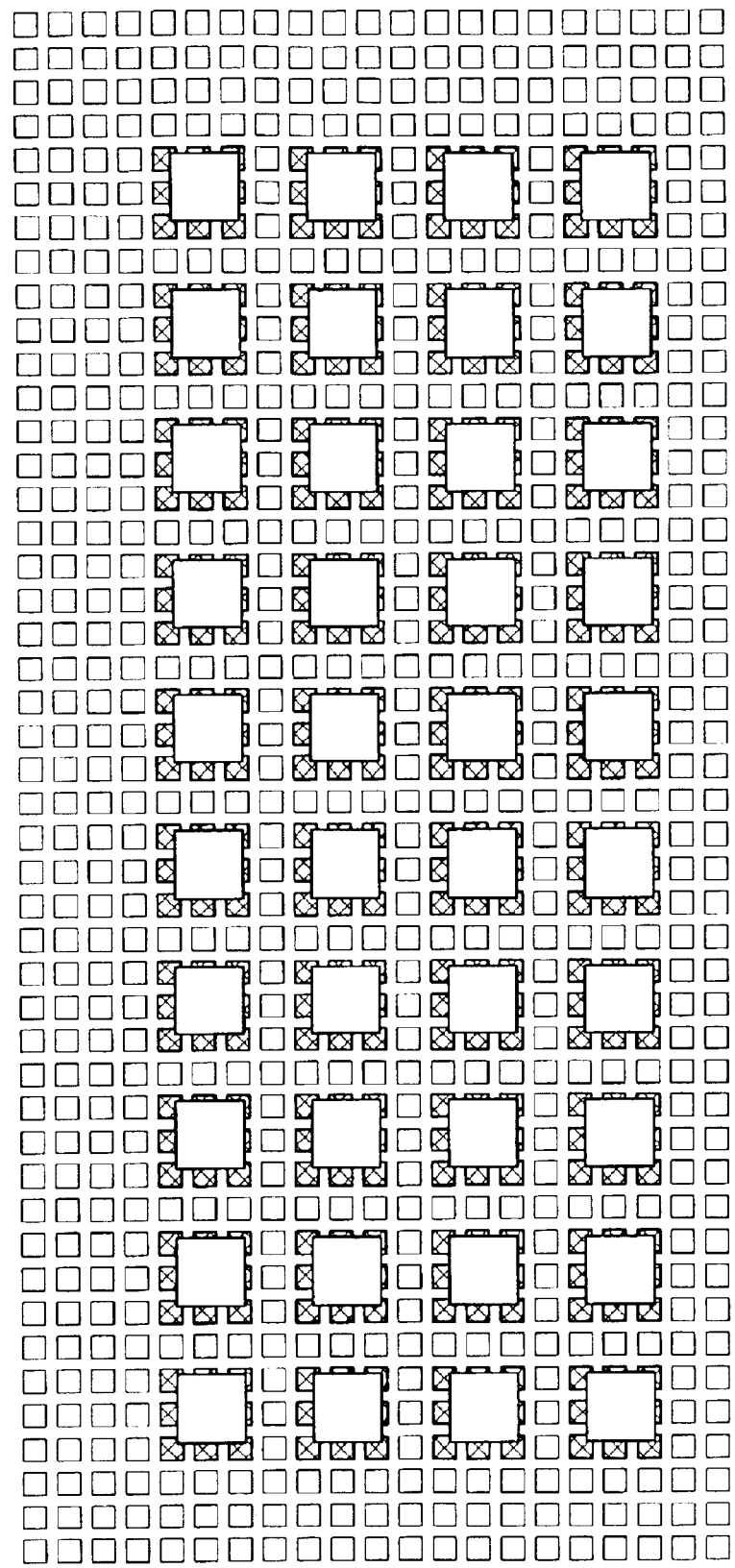
FIG. 3 illustrates aligned receiver pads overlapping with transmitter pads in accordance with an embodiment of the present invention.

FIG. 3 provides an overview of a four-by-ten array of receiver pads aligned over transmitter pads, wherein the transmitter pads have a four times higher spatial frequency than receiver pads. In FIG. 3, the active transmitter pads are highlighted with cross hatching.

Figure 4:
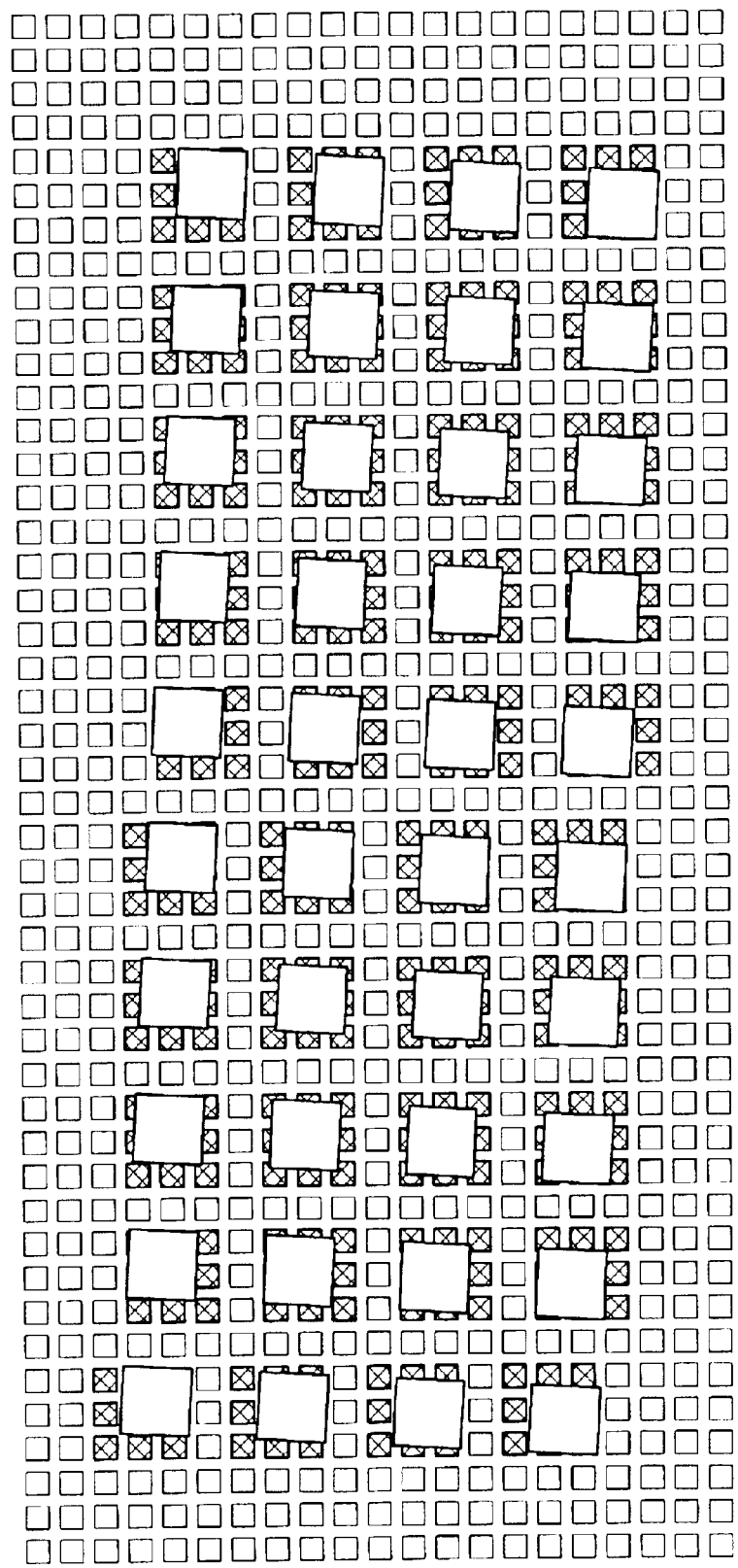
FIG. 4 illustrates misaligned receiver pads overlapping with transmitter pads in accordance with an embodiment of the present invention.

FIG. 4 provides an overview of the same receiver and transmitter pads, except that the receiver pads are misaligned with slight translational and rotational errors. As in FIG. 3, the active transmitter pads are highlighted. FIG. 3 shows how transmitter pads can be activated so that the receiver pads are properly covered in spite of moderate translational and rotational errors.

Model of Sensitivity to Displacement

We now present a mathematical model that analyzes sensitivity to displacement. In doing so, the model considers translations in both x and y directions individually, and assumes that pads are square. An important parameter in this model is how much charge is transferred between the chips. This charge transfer is related to the capacitance overlap. Note that the pad pitch can be expected to be larger than the transmitter to receiver pad spacing (e.g., 25:m pad pitch versus 2:m spacing). Hence, the fringe fields on the edges of the pads can be ignored in a first-order analysis. Thus, the capacitance between the receiver and transmitter pads is approximately proportional to the overlap area between the transmitter and receiver pads.

Maximum Displacement for Fixed Transmitter and Receiver Pads

Figure 5:
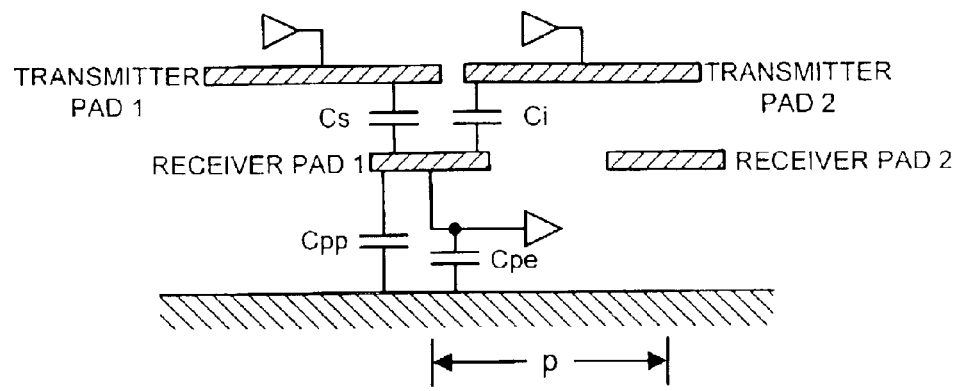
FIG. 5 illustrates a cross-section of capacitances in accordance with an embodiment of the present invention.

FIG. 5 illustrates a simple model for fixed transmitter and receiver pads that are not electronically adjustable. These pads have a specific fill factor. For example, FIG. 1 illustrates a cross-section of a configuration with a nearly 100% area fill factor for transmitter pads and a 25% area fill factor (50% in the linear dimension) for receiver pads. Note that the pitch, p, is the center-to-center distance between successive receiver pads. Also note that the term "fill factor" refers to the percentage of chip area covered by transmitter pads or receiver pads.

Consider the capacitive signal coupling when the receiver pad is not horizontally aligned on the center of the transmitter pad. Given a voltage swing on the transmitter pad of Vtx, the received voltage swing on the receiver pad1, Vrx, can be modeled by the equation, $$\frac{Vrxpad1}{Vtxpad1} = \frac{Cs - Ci}{Cs + Ci + Cpp + Cpe},$$

wherein

Cs is the coupling capacitance transmitting the signal;

Ci is the coupling capacitance to neighboring driving transmitter pads when the receiver pad is misaligned with the transmitter pad;

Cpp is the metal to metal parasitic capacitance from the receiver pad to surrounding metal structures;

Cpe is the parasitic input capacitance of the receiver sense amplifier; and p is the pitch between adjacent receiver pads.

In the worst case, signal transitions on transmitter pad2 are opposite to the signal transitions on transmitter pad1. In this case, the parasitic coupling capacitance Ci appears in the numerator, subtracting from the signal coupling capacitance.

Note that Cpp and Cpe are constant with respect to receiver misalignment. Also, if the transmitter pads have nearly a 100% fill factor and fringing fields are ignored, then the sum of Cs and Ci is constant with respect to receiver misalignment. Hence, if the receiver pads are not aligned with the transmitter pads, then Cs decreases and Ci increases. When the misalignment reaches p/2, then Ci equals Cs and the signal is completely corrupted.

Receiver and Transmitter Fill Factors

If the receiver can be perfectly aligned with the transmitter, then the fill factor for both the receiver and transmitter is ideally 100% to maximize the received signal amplitude. However, if the receiver may be misaligned, then the area fill factor of the receiver should be smaller than 100%. Note that the portion of the receiver pad that is not capacitively coupling to the transmitted signal reduces the received signal in two ways. First, the receiver pad has a back-plate area capacitance that parasitically loads the signal. Second, the overlap of the receiver pad with adjacent transmitter pads introduces additional noise.

Consider the case where the receiver pads are about vertically centered between transmitter pads above and the shielding metal layers below. To simplify the analysis, assume that the receiver sense amplifier has no parasitic capacitance so Cpe is zero. Given this assumption, FIG. 6 illustrates the received signal versus linear misalignment for a fixed transmitter pad array.

Figure 6:
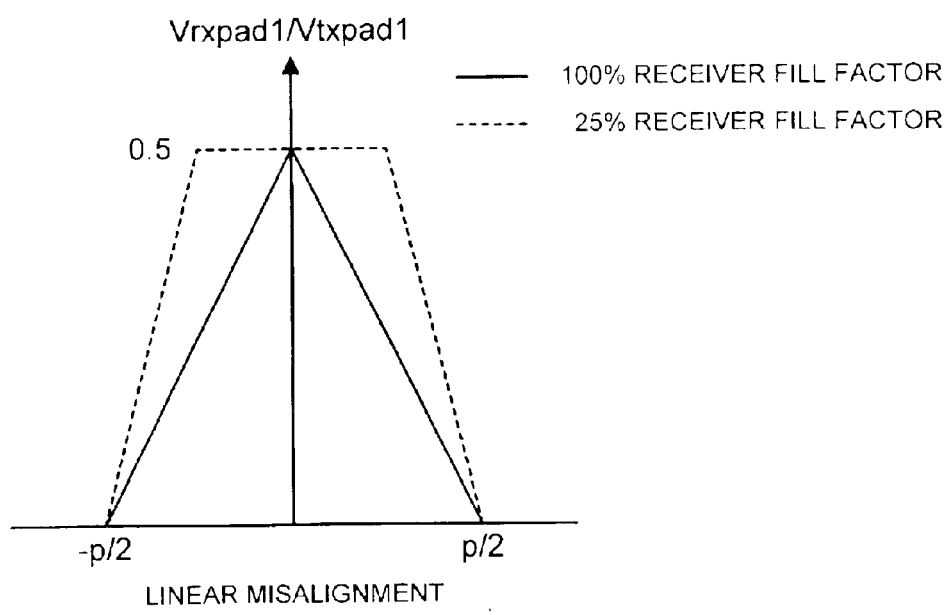
FIG. 6 presents a graph of the received signal as a function of misalignment in accordance with an embodiment of the present invention.

As can be seen from FIG. 6, regardless of the transmitter and receiver fill factors, when the transmitter and receiver pads misalign by one-half of the pad pitch in either the x or y direction, the capacitively transferred signal drops to zero. For a misalignment of p/2, receiver pads overlap either blank space between transmitter pads, or equal amounts of actively driven pad and adjacent pad. In the first case, no signal is coupled. In the second case, two signals are equally coupled. For some data patterns, the signals will have opposite swing and the coupled signals from the driven and adjacent pads cancel each other.

If Cpe is non-zero, the signal transfer for the 25% fill factor case decreases more than that for the 100% fill factor case. However, the signal transfer for the 25% fill factor case still maintains its maximum value for linear displacements up to p/4.

Transmitter fill factors of 100% provide more signal transfer, but do not provide a passive return path for the capacitively coupled current. Hence, for fixed transmitter and receiver pads it may be necessary to surround the transmitting pads with undriven metal lines. These undriven lines can carry power and ground currents and can provide return paths for the signal currents.

Advantages of Using Transmitter Pads for Electronic Adjustment

In one embodiment of the present invention, signal routing is performed on the receiver side. This embodiment is sensitive to parasitic capacitance at the receiver inputs. Note that a receiver may require a sense amplifier to detect the input signal, which makes the receiving node more sensitive to parasitic capacitance. This can be a problem because a de-multiplexing operation performed at the receiver inputs can add parasitic capacitance to these sensitive nodes. If the de-multiplexing operation is alternatively preformed after the sense amplifiers, it can make the problem of retiming the data more difficult.

In contrast, transmitter nodes are less sensitive to parasitic capacitance than the receiver nodes, and the delay caused by the multiplexing circuits on the transmitter side can easily be absorbed into the transmitter latency.

High-Level Model for Transmitter Circuits

Figure 7:
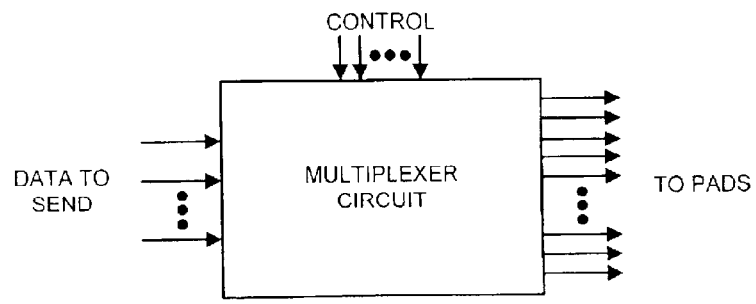
FIG. 7 illustrates a multiplexer circuit in accordance with an embodiment of the present invention.

FIG. 7 illustrates a multiplexer circuit for the transmitter. As is illustrated in FIG. 7, a number of data bits are routed through the multiplexer circuit to a greater number of transmitter pads. The control inputs at the top of FIG. 7 serve to steer the data inputs to the proper transmitting locations. This multiplexer circuit is configured so that the transmitter pads are aligned with corresponding receiver pads on the opposing chip.

4-tuple Designation of Electronically Adjustable Transmitter Pad Array

A rectangular electronically adjustable transmitter array can be described by four parameters:

k—the ratio of spatial frequency of transmitter pads to spatial frequency of receiver pads;

m—the number of transmitter pads in a row used to transmit a signal;

n—the width of the transmitter pad group surround used to transmit the opposite of a signal (This is used to provide a return path for the signal current.); and r—the number of transmitter pad positions by which a given transmitter bit can be shifted. Hence, each transmitter array can be specified by the 4-tuple:<k,m,n,r>. Here are some example arrays:

<1,1,0,0>—fixed transmitter array where the spatial frequency for transmitter pads is the same as the spatial frequency for receiver pads;

<2,2,0,1>—2× transmitter pad spatial frequency increase, one additional pad position of margin, for an additional p/2 of misalignment tolerance compared to <1,1,0,0>;

<3,2,0,3>—3× transmitter pad spatial frequency increase, with three additional pad positions of margin, for an additional distance of one receiver pad pitch, p, of misalignment tolerance compared to <1,1,0,0>; and <4,3,1,4>—4× transmitter pad spatial frequency increase, with four additional pad positions of margin, where the transmitter pad groups include three-by-three pads that transmit the signal and seven additional surrounding pads that transmit the opposite of the signal to cancel the signal current.

Figure 8:
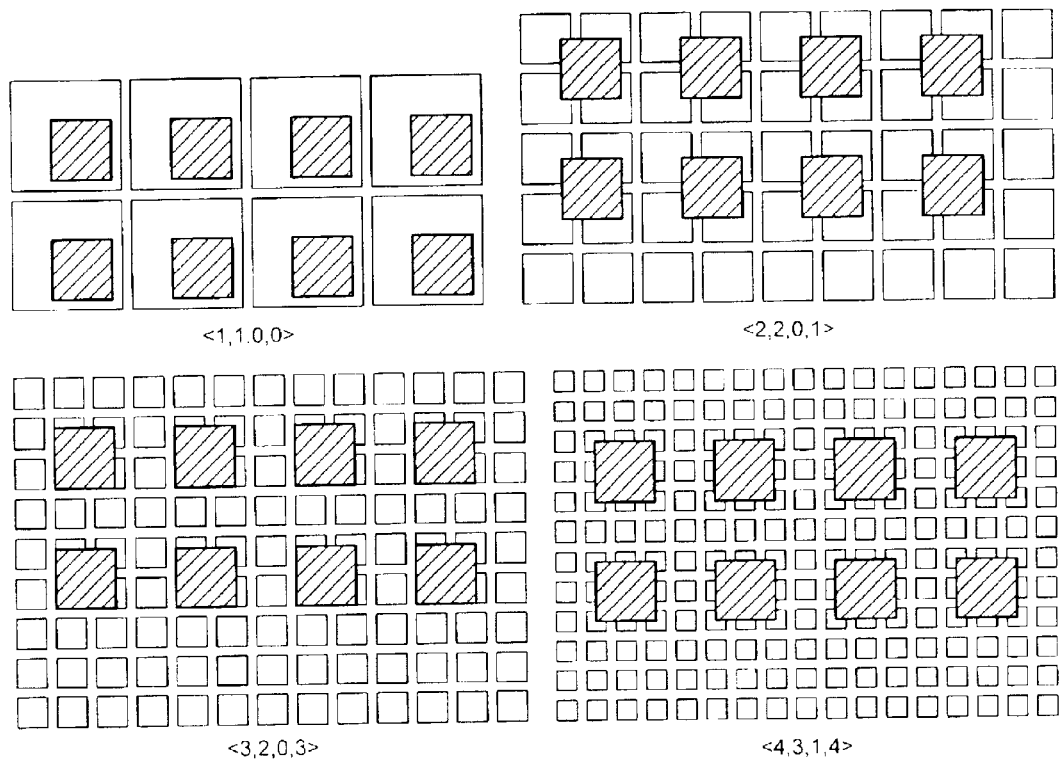
FIG. 8 illustrates different transmitter arrays in accordance with an embodiment of the present invention.

An overview of these four transmitter arrangements is shown in FIG. 8 for a four-by-two array of receiver pads.

Figures 9, 10:
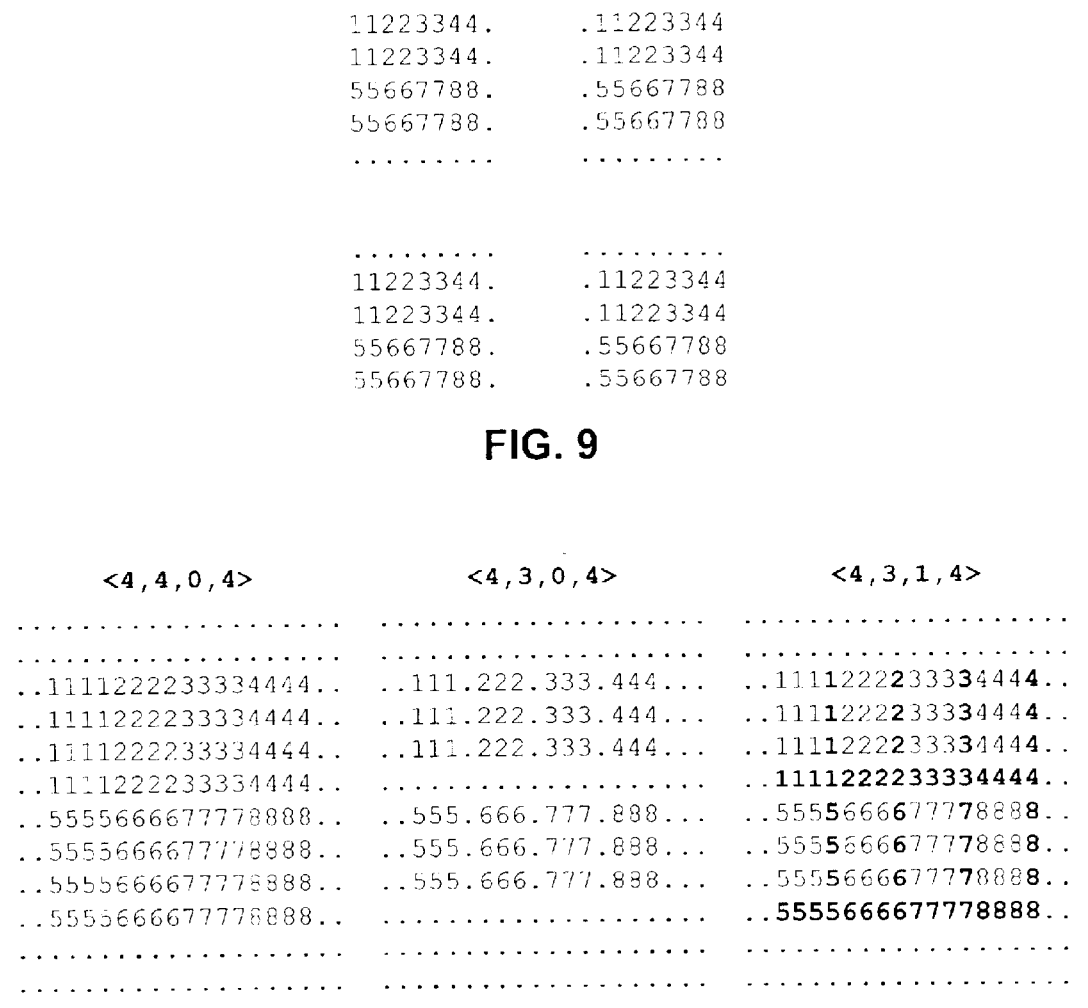

FIG. 9 illustrates four possible transmitter pad electrical assignments for a <2,2,0,1> transmitter pad array. The values 1 through 8 specify which signal each individual transmitter pad sends. Although they are not illustrated in FIG. 9, receiver pads 1 through 8 overlap their corresponding transmitter pads.

FIG. 10 illustrates electrical assignments for the transmitter pad positions for some <4,*,*,4> arrays. The <4,4,0,4> array drives four-by-four squares of pads for each receiver. If the receiver pads are small enough, for example a 25% fill factor, then a three-by-three square suffices to drive one receiver pad. The <4,3,0,4> array does this.

An additional permutation is shown in the <4,3,1,4> array. In this array, the bold characters show where the inverse of the signal is driven onto the transmitter pads. Note that driving the inverse of the signal provides a return current for the signals driven by the transmitter pad.

The electrical assignment of pads in the <4,*,*,4> arrays can be shifted left or right and up or down from the assignments shown in FIG. 10. The <4,4,0,4> and <4,3,1,4> array have five horizontal positions and five vertical positions, or 25 positions overall. The <4,3,0,4> array has six horizontal positions and six vertical positions, or 36 positions overall.

If angular errors are small, then simple row and column addressing can be used. If angular errors are larger, then it may be necessary to include the ability to "shift" the row and column addresses at one or more locations across the array.

Figure 11:
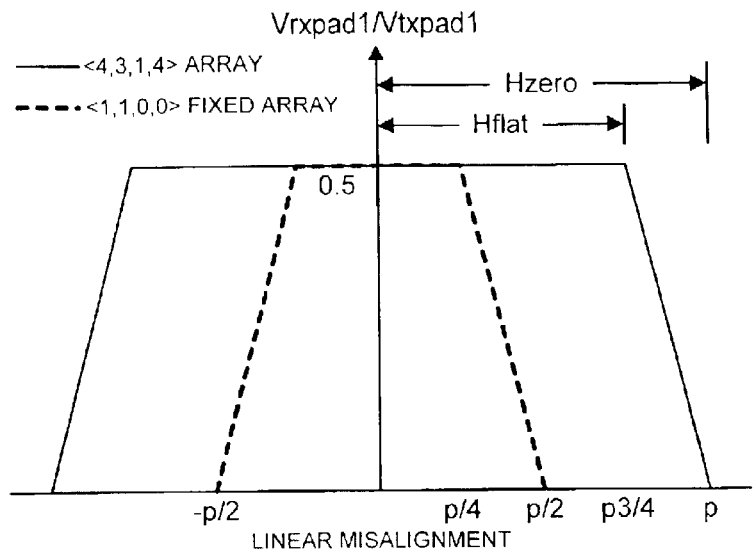
FIG. 11 illustrates the received signal as a function of misalignment in accordance with an embodiment of the present invention.

FIG. 11 illustrates the additional lateral alignment margin provided by the <4,3,1,4> transmitter pad array. The functions plotted in FIG. 11 use the same capacitance model used in FIG. 6. The receiver pads here are assumed to have a 25% fill factor.

In general, the horizontal part of the transfer curve is extended from p/4 for the fixed array to $$Hflat = p \cdot \left(\frac{1}{4} + \frac{r}{2k}\right)$$

and the transfer curve zero crossing extends from p/2 for the fixed array to $$Hzero = p \cdot \left(\frac{1}{2} + \frac{r}{2k}\right)$$

Multiplexing Circuits

The multiplexing array required to accomplish the electronic adjustment can be composed of a column array and a row array with a first array feeding into a second array, and the second array driving the transmitter pads.

Figure 12:
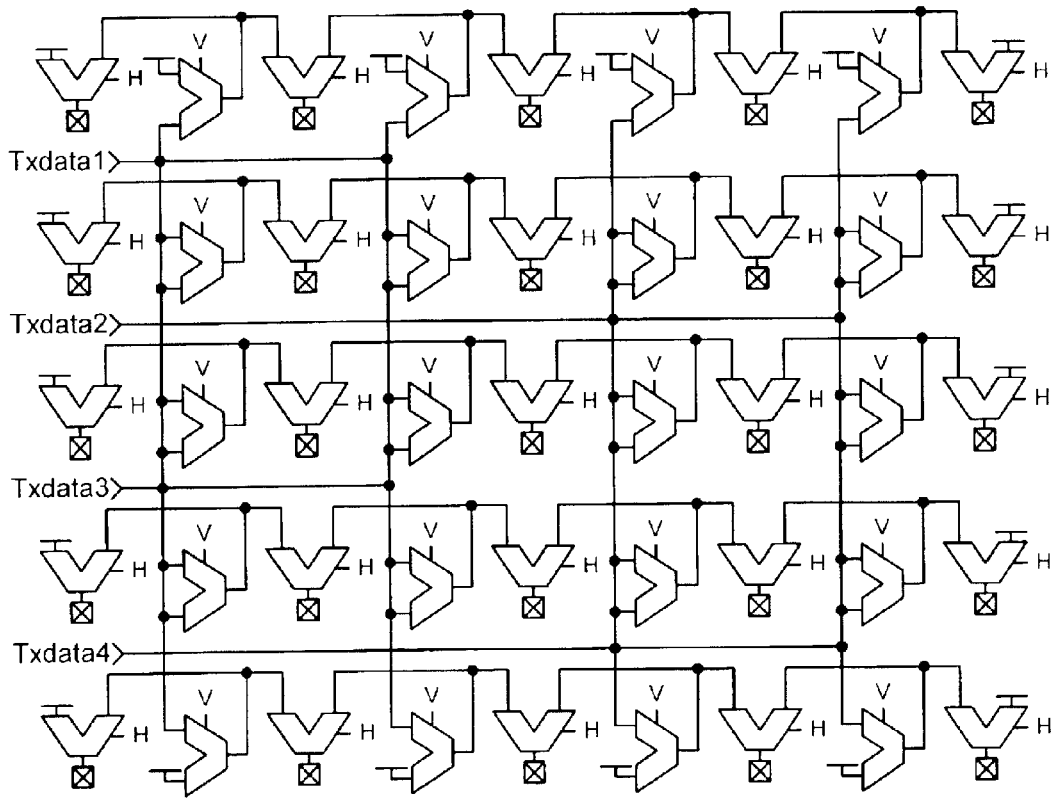
FIG. 12 illustrates a multiplexing array in accordance with an embodiment of the present invention.

FIG. 12 illustrates a multiplexing array that can be used to drive a <2,2,0,1> transmitter pad array. In FIG. 12, H selects the left or right input to all horizontal multiplexers; V selects the top or bottom input to all vertical multiplexers; and Txdata1-4 represents the four data values for the two-by-two receiver array.

In FIG. 12, the multiplexing arrays have some redundancy, and thus can be simplified. For simplicity, the circuit in FIG. 12 is illustrated with all circuit elements and inputs connected. Note that all vertical multiplexers see the same V control signal, and all horizontal multiplexers see the same H control signal.

Figure 13:
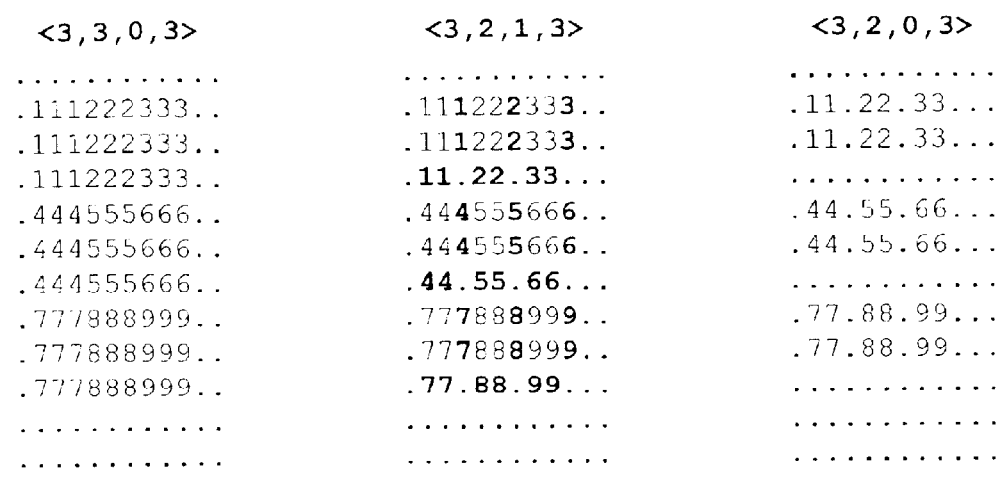
Figure 14:
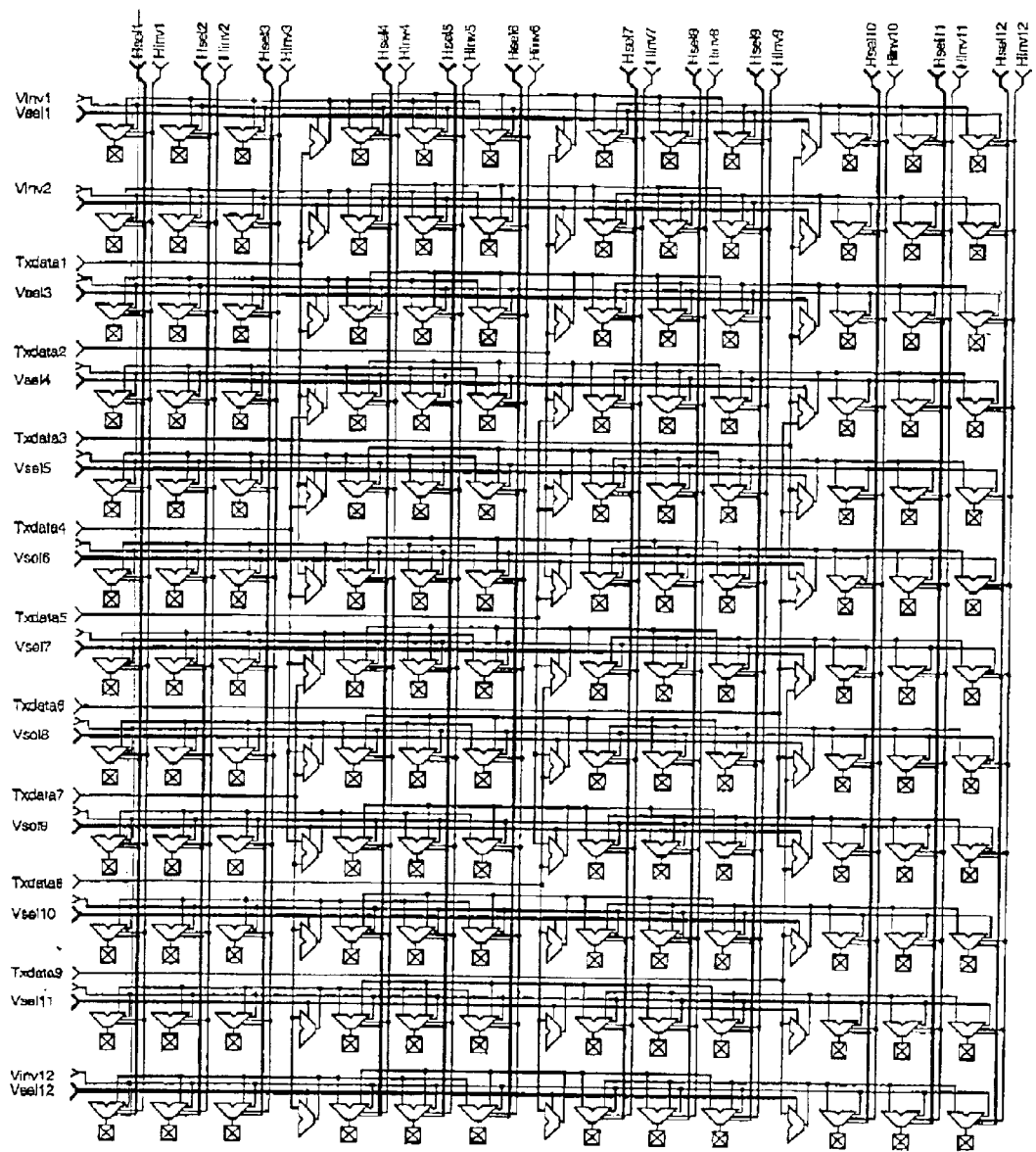
FIG. 14 illustrates another multiplexing array in accordance with an embodiment of the present invention.

Next, we consider a more complex example that includes both positive and inverted signals as well as non-driven pads in the transmitter pad array. FIG. 13 illustrates three possible electrical assignments to pads for a 3× spatial frequency of transmitter pads with three pads of extra shift positions. FIG. 14 illustrates the multiplexer circuits for the <3,2,1,3> transmitter pad array. This multiplexer array runs different shift values in each horizontal and vertical selection control line. This involves using inversion selection signals to select inverted or idled signals in the horizontal multiplexers. Both the row and column inversion signals are used in the horizontal multiplexers to idle the transmitter pads at the corner among four transmitter pad groups.

In FIG. 14, each of the nine transmitter data values, for the three-by-three array or receiver pads, is loaded by six multiplexer inputs. Similarly, the second stage of multiplexing loads the first stage of multiplexers again with six multiplexer inputs. Moreover, five horizontal wire routing channels are needed between transmitter pads. On average, about three vertical wire routing channels are required between transmitter pads.

Figure 15:
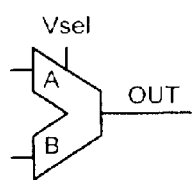
FIG. 15 illustrates truth tables for vertical and horizontal multiplexers from the multiplexing array in FIG. 14 in accordance with an embodiment of the present invention.
Figure 15:
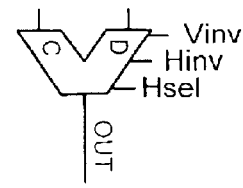

The truth tables for the vertical and horizontal selection multiplexers are illustrated in FIG. 15. The vertical multiplexers simply select the transmit value above or below the multiplexer. The horizontal multiplexers receive both the vertical and horizontal inverter selection signals, Vinv and Hinv, respectively. The truth table shows that if one of the two inversion selections is TRUE, then the horizontal multiplexer inverts its output. However, if both Hinv and Vinv are TRUE, the output is held constant at ground. This logic function creates the electrical assignment pattern shown for the <3,2,1,3> array in FIG. 13. Note that this assignment pattern has an equal number of signal and inverted signal pads, providing a return current path for each signal so as to reduce the noise in the chips.

Other Variations

There are many possible variations of the invention, a few of which are briefly discussed below.

In one variation, electronic adjustment are performed at the receiver pads rather than the transmitter pads. In this variation, each receiver pad receives some data, which is then de-multiplexed to compensate for alignment variations. Note that in the most general case, both the receiver pads and transmitter pads can be electronically adjustable.

In one variation, transmitter and receiver pads can have a shape other than a square. Possible shapes include rectangles, hexagons, octagons and triangles. Note that these additional shapes may increase the minimum overlap of transmitter and receiver pads, and may add complexity in determining which transmitter pads to enable.

In one variation, the array can be non-rectangular. For example, the array can be elliptical, trapezoidal, or L-shaped.

In one variation, x and y directions can have different spatial frequencies, alignment tolerances, or actively driven extents. This is a useful optimization if one direction can be mechanically aligned to a greater precision than the other.

In one variation, the coupling between transmitter pads and receiver pads is optical instead of capacitive.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for electronically aligning pads on different semiconductor chips to facilitate communication between the semiconductor chips through capacitive coupling, comprising:

measuring an alignment between a first chip and a second chip;

wherein the first chip is situated face-to-face with the second chip so that transmitter pads on the first chip are capacitively coupled with receiver pads on the second chip;

wherein the transmitter pads are located in the highest metal layer of the first chip; and wherein the receiver pads are located in the highest metal layer of the second chip;

using the measured alignment to associate transmitter pads on the first chip with proximate receiver pads on the second chip; and selectively routing data signals to transmitter pads on the first chip so that the data signals are communicated through capacitive coupling to intended receiver pads in the second chip that are proximate to the transmitter pads.

2. The method of claim 1,
wherein there are a greater number of smaller transmitter pads than receiver pads so that multiple transmitter pads can drive a single receiver pad; and
wherein selectively routing data signals involves driving multiple transmitter pads under a single receiver pad with the same signal.

3. The method of claim 2, wherein driving the multiple transmitter pads with the same signal additionally involves driving adjacent transmitter pads with an inverse signal to provide return current.

4. The method of claim 1, wherein the transmitter pads collectively cover more area than the receiver pads so that the receiver pads remain proximate to transmitter pads in spite of alignment variations between the first chip and the second chip.

5. The method of claim 1,
wherein the transmitter pads are covered by an overglass layer on the first chip; and
wherein the receiver pads are covered by an overglass layer on the second chip.

6. The method of claim 1, wherein selectively routing the data signals to transmitter pads involves using a multiplexing array to selectively route the data signals.

7. The method of claim 1, wherein the method is performed periodically or continuously.

8. The method of claim 1,
wherein the transmitter pads are arranged in a two-dimensional array on the first chip; and
wherein the receiver pads are arranged in a two-dimensional array on the second chip.

9. The method of claim 1, wherein the receiver pads and transmitter pads are square.

10. The method of claim 1, wherein the receiver pads and the transmitter pads are not square.

11. An apparatus that electronically aligns pads on different semiconductor chips to facilitate communication between the semiconductor chips through capacitive coupling, comprising:
a first chip;
a second chip;
wherein the first chip is situated face-to-face with the second chip so that transmitter pads on the first chip are capacitively coupled with receiver pads on the second chip;
wherein the transmitter pads are located in the highest metal layer of the first chip; and
wherein the receiver pads are located in the highest metal layer of the second chip;
a measurement mechanism that is configured to measure an alignment between the first chip and the second chip;
an association mechanism that is configured to use the measured alignment to associate transmitter pads on the first chip with proximate receiver pads on the second chip; and
a routing mechanism that is configured to selectively route data signals to transmitter pads on the first chip so that the data signals are communicated through capacitive coupling to intended receiver pads in the second chip that are proximate to the transmitter pads.

12. The apparatus of claim 11,
wherein there are a greater number of smaller transmitter pads than receiver pads so that multiple transmitter pads can drive a single receiver pad; and
wherein selectively routing data signals involves driving multiple transmitter pads under a single receiver pad with the same signal.

13. The apparatus of claim 12, wherein the routing mechanism is configured to drive adjacent transmitter pads with an inverse signal to provide return current.

14. The apparatus of claim 11, wherein the transmitter pads collectively cover more area than the receiver pads so that the receiver pads remain proximate to transmitter pads in spite of alignment variations between the first chip and the second chip.

15. The apparatus of claim 11,
wherein the transmitter pads are covered by an overglass layer on the first chip; and
wherein the receiver pads are covered by an overglass layer on the second chip.

16. The apparatus of claim 11, wherein selectively routing the data signals to transmitter pads involves using a multiplexing array to selectively route the data signals.

17. The apparatus of claim 11, wherein the apparatus operates periodically or continuously.

18. The apparatus of claim 11,
wherein the transmitter pads are arranged in a two-dimensional array on the first chip; and
wherein the receiver pads are arranged in a two-dimensional array on the second chip.

19. The apparatus of claim 11, wherein the receiver pads and transmitter pads are square.

20. The apparatus of claim 11, wherein the receiver pads and the transmitter pads are not square.

21. A computer system that electronically aligns pads on different constituent semiconductor chips to facilitate communication between the semiconductor chips through capacitive coupling, comprising:
a first chip containing a processor;
a second chip containing a memory;
wherein the first chip is situated face-to-face with the second chip so that transmitter pads on the first chip are capacitively coupled with receiver pads on the second chip;
a measurement mechanism that is configured to measure an alignment between the first chip and the second chip;
an association mechanism that is configured to use the measured alignment to associate transmitter pads on the first chip with proximate receiver pads on the second chip; and
a routing mechanism that is configured to selectively route data signals to transmitter pads on the first chip so that the data signals are communicated through capacitive coupling to intended receiver pads in the second chip that are proximate to the transmitter pads.

22. An apparatus that electronically aligns pads on different semiconductor chips to facilitate communication between the semiconductor chips through capacitive coupling, comprising:
a first chip;
a second chip;
wherein the first chip is situated face-to-face with the second chip so that transmitter pads on the first chip are capacitively coupled with receiver pads on the second chip;

wherein the transmitter pads are located in the highest metal layer of the first chip; and wherein the receiver pads are located in the highest metal layer of the second chip;

a measurement mechanism that is configured to measure an alignment between the first chip and the second chip;

an association mechanism that is configured to use the measured alignment to associate transmitter pads on the first chip with proximate receiver pads on the second chip; and a routing mechanism that is configured to selectively route data signals from receiver pads on the second chip so that the selected data signals are received through capacitive coupling from selected transmitter pads on the first chip.

23. The apparatus of claim 22, wherein the receiver pads collectively cover more area than the transmitter pads so that the transmitter pads remain proximate to receiver pads in spite of alignment variations between the first chip and the second chip.

24. The apparatus of claim 22, wherein selectively routing the data signals from receiver pads involves using a multiplexing array to selectively route the data signals.

25. A method for electronically aligning pads on different semiconductor chips to facilitate communication between the semiconductor chips through optical coupling, comprising:

measuring an alignment between a first chip and a second chip;

wherein the first chip is situated face-to-face with the second chip so that transmitter pads on the first chip are optically coupled with receiver pads on the second chip;

wherein the transmitter pads are located in the highest metal layer of the first chip; and wherein the receiver pads are located in the highest metal layer of the second chip;

using the measured alignment to associate transmitter pads on the first chip with proximate receiver pads on the second chip; and selectively routing data signals to transmitter pads on the first chip so that the data signals are communicated through optical coupling to intended receiver pads in the second chip that are proximate to the transmitter pads.

* * * * *